US009269754B2

(12) United States Patent
Lee et al.

(10) Patent No.: US 9,269,754 B2
(45) Date of Patent: Feb. 23, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Baek-Hee Lee, Yongin (KR); Seung-Won Park, Yongin (KR); Won-Sang Park, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/467,172

(22) Filed: Aug. 25, 2014

(65) Prior Publication Data

US 2015/0295014 A1 Oct. 15, 2015

(30) Foreign Application Priority Data

Apr. 14, 2014 (KR) .................... 10-2014-0044427

(51) Int. Cl.
*H01L 51/00* (2006.01)
*H01L 27/32* (2006.01)
*H01L 51/52* (2006.01)
*H01L 51/56* (2006.01)

(52) U.S. Cl.
CPC ........ *H01L 27/3246* (2013.01); *H01L 51/5209* (2013.01); *H01L 51/5268* (2013.01); *H01L 51/56* (2013.01)

(58) Field of Classification Search
CPC ..... H01L 51/0545; H01L 51/56; H01L 51/50; H01L 51/525; H01L 51/5268

USPC .......................... 257/40, E51, 22; 438/82, 99
See application file for complete search history.

(56) References Cited

U.S. PATENT DOCUMENTS

| | | | |
|---|---|---|---|
| 2006/0009133 A1 | 1/2006 | Hashimoto et al. | |
| 2010/0308317 A1* | 12/2010 | Ahn et al. | ........................ 257/40 |
| 2011/0114963 A1* | 5/2011 | Son et al. | ........................ 257/72 |
| 2011/0220879 A1* | 9/2011 | Im et al. | ........................ 257/40 |
| 2013/0153871 A1 | 6/2013 | Ma et al. | |
| 2013/0187163 A1 | 7/2013 | Kim et al. | |
| 2014/0183472 A1* | 7/2014 | Kim et al. | ........................ 257/40 |
| 2015/0076457 A1 | 3/2015 | Kwon et al. | |
| 2015/0102325 A1 | 4/2015 | Lim et al. | |
| 2015/0115217 A1 | 4/2015 | Cho et al. | |

FOREIGN PATENT DOCUMENTS

KR   1020040010342 A   1/2004
KR   1020090002742 A   1/2009

(Continued)

OTHER PUBLICATIONS

Suzuki et al., "Optical Lithography Modeling", Microlithography, Science and Technology 2nd edition, May 11, 2007, p. 111.

*Primary Examiner* — Jasmine Clark
(74) *Attorney, Agent, or Firm* — Cantor Colburn LLP

(57) ABSTRACT

An organic light-emitting display apparatus includes a substrate, a first electrode disposed on the substrate, a pixel-defining layer which is disposed on the substrate and the first electrode and in which an opening which exposes a central part of the first electrode is defined, an interlayer which is disposed on the first electrode and comprises an organic light-emitting layer; and a second electrode disposed on the interlayer, where a sidewall of the opening comprises a bumpy structure in which a plurality of bumps is disposed.

20 Claims, 11 Drawing Sheets

(56) References Cited

FOREIGN PATENT DOCUMENTS

| KR | 1020130085195 A | 7/2013 |
| KR | 1020150031102 A | 3/2015 |
| KR | 1020150042937 A | 4/2015 |
| KR | 1020150047401 A | 5/2015 |

\* cited by examiner

ORGANIC LIGHT-EMITTING DISPLAY APPARATUS AND METHOD OF MANUFACTURING THE SAME

This application claims priority to Korean Patent Application No. 10-2014-0044427, filed on Apr. 14, 2014, and all the benefits accruing therefrom under 35 U.S.C. §119, the disclosure of which is incorporated herein in its entirety by reference.

BACKGROUND

1. Field

One or more embodiments of the invention relate to an organic light-emitting display apparatus and a method of manufacturing the same.

2. Description of the Related Art

An organic light-emitting display apparatus is a self-emission display which is formed by using an organic light-emitting diode ("OLED") which generally includes a hole injection electrode, an electron injection electrode, and an organic light-emitting layer formed therebetween. The organic light-emitting display apparatus emits light when an exciton, generated when a hole injected from the hole injection electrode and an electron injected from the electron injection electrode are combined, drops from an excitation state to a ground state.

Since the organic light-emitting display apparatus, which is a self-emission display, does not need an additional power source, the organic light-emitting display apparatus may be driven with a low voltage and may be formed as a light film. Additionally, the organic light-emitting display apparatus provides high-quality characteristics such as wide viewing angles, high contrast, and rapid responses. Thus, the organic light-emitting display apparatus has gained attention as a next-generation display apparatus.

SUMMARY

One or more exemplary embodiments of the invention include an organic light-emitting display apparatus and a method of manufacturing the same.

Additional exemplary embodiments will be set forth in region in the description which follows and, in part, will be apparent from the description, or may be learned by practice of the presented exemplary embodiments.

According to one or more exemplary embodiments of the invention, an organic light-emitting display apparatus includes a substrate, a first electrode disposed on the substrate, a pixel-defining layer that is disposed on the substrate and the first electrode and has an opening that exposes a central part of the first electrode, an interlayer that is disposed on the first electrode and includes an organic light-emitting layer, and a second electrode disposed on the interlayer, where a sidewall of the opening includes a bumpy structure in which a plurality of bumps are disposed, and the bumpy structure is provided by a light-exposing process using a standing wave when defining the opening.

In an exemplary embodiment, the pixel-defining layer may include a transparent photosensitive polymer.

In an exemplary embodiment, a width of each of the plurality of bumps may be in a range of about 10 nanometers (nm) to about 500 nm.

In an exemplary embodiment, scattering particles in a nanosize may be dispersed inside the pixel-defining layer.

In an exemplary embodiment, the scattering particles may include at least one of silica, $TiO_2$, and $ZrO_2$.

In an exemplary embodiment, the scattering particles may include at least one of polystyrene and polymethyl methacrylate ("PMMA").

In an exemplary embodiment, a width of each of the plurality of bumps and an inclination angle of the sidewall may depend on a wavelength of light emitted from the interlayer.

In an exemplary embodiment, the first electrode may include an inclined part having a slope with respect to a surface of the substrate at each end.

In an exemplary embodiment, the inclined part may be substantially perpendicular to the surface of the substrate.

According to one or more exemplary embodiments of the invention, a method of manufacturing an organic light-emitting display apparatus includes disposing a first electrode on a substrate, providing a pixel-defining layer that is disposed on the substrate and the first electrode and has an opening exposing a central part of the first electrode, disposing an interlayer on the first electrode, the interlayer including an organic light-emitting layer, and disposing a second electrode on the interlayer, where a sidewall of the opening has a bumpy structure in which a plurality of bumps are provided, and the bumpy structure is provided by an exposing process using a standing wave when defining the opening.

In an exemplary embodiment, the providing the pixel-defining layer may include disposing a photosensitive polymer on the substrate and the first electrode, exposing an area where an opening will be provided, and defining the opening by etching the photosensitive polymer, where a standing wave is provided between an upper surface of the first electrode and an upper surface of the photosensitive polymer due to the exposing of the area.

In an exemplary embodiment, the exposing of the area may be performed by a single-wavelength light source.

In an exemplary embodiment, the method may further include hardening the pixel-defining layer at a first temperature for a first period of time, and hardening the pixel-defining layer at a second temperature, which is higher than the first temperature, for a second period of time, after the providing the pixel-defining layer, where the first temperature is lower than a temperature at which the pixel-defining layer is reflowed, and the first period of time is longer than the second period of time.

In an exemplary embodiment, the first electrode may include a material that reflects light, which performs the exposing of the area.

In an exemplary embodiment, a width of each of the plurality of bumps may be substantially $\lambda/2n$ (where, $\lambda$ is a wavelength of light performing the exposing and n is a refractive index of the pixel-defining layer).

In an exemplary embodiment, a width of each of the plurality of bumps may be in a range of about 10 nm to about 500 nm.

In an exemplary embodiment, scattering particles in a nanosize may be dispersed inside the pixel-defining layer.

In an exemplary embodiment, the scattering particles may include at least one of silica, $TiO_2$, and $ZrO_2$.

In an exemplary embodiment, the scattering particles may include at least one of polystyrene and polymethyl methacrylate ("PMMA").

In an exemplary embodiment, a width of each of the plurality of bumps and an inclination angle of the sidewall may depend on a wavelength of light emitted from the interlayer.

BRIEF DESCRIPTION OF THE DRAWINGS

These and/or other exemplary embodiments will become apparent and more readily appreciated from the following description of the exemplary embodiments, taken in conjunction with the accompanying drawings, in which.

DETAILED DESCRIPTION

Figure 1:
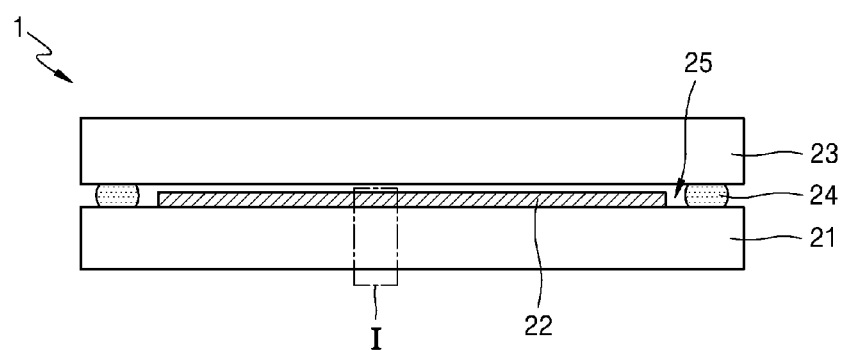
FIG. 1 is a cross-sectional view of exemplary embodiments of organic light-emitting display apparatuses according to the invention.

Reference will now be made in detail to exemplary embodiments, examples of which are illustrated in the accompanying drawings, in which like reference numerals refer to like elements throughout. In this regard, the exemplary embodiments may have different forms and should not be construed as being limited to the descriptions set forth herein. Accordingly, the exemplary embodiments are merely described below, by referring to the figures, to explain exemplary embodiments of the description.

Hereinafter, the invention will be described in detail by explaining exemplary embodiments of the invention with reference to the attached drawings. Like reference numerals in the drawings denote like elements, and thus their description will be omitted. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another. Thus, "a first element," "component," "region," "layer" or "section" discussed below could be termed a second element, component, region, layer or section without departing from the teachings herein.

As used herein, the singular forms "a," "an" and "the" are intended to include the plural forms as well, unless the context clearly indicates otherwise. As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Sizes of elements in the drawings may be exaggerated for convenience of explanation. In other words, since sizes and thicknesses of components in the drawings are arbitrarily illustrated for convenience of explanation, the following exemplary embodiments are not limited thereto.

Figure 2:
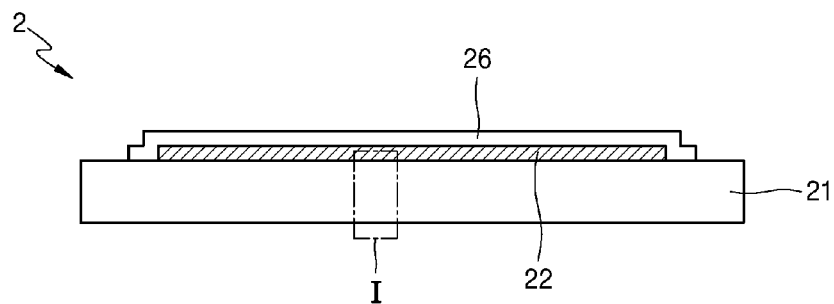
FIG. 2 is a cross-sectional view of another exemplary embodiment of an organic light-emitting display apparatus according to the invention.

FIGS. 1 and 2 are cross-sectional views of organic light-emitting display apparatuses 1 and 2 according to exemplary embodiments of the invention.

Referring to FIG. 1, the organic light-emitting display apparatus 1 includes an organic light-emitting unit 22 provided on a substrate 21, and a sealing substrate 23 that seals the organic light-emitting unit 22.

The sealing substrate 23 includes a transparent material so that an image from the organic light-emitting unit 22 may be displayed on the sealing substrate 23. The sealing substrate 23 serves to prevent oxygen and water penetration into the organic light-emitting unit 22.

Edges of the substrate 21 and the sealing substrate 23 are attached to each other by a sealing member 24, and thus an inner space 25 between the substrate 21 and the sealing substrate 23 is defined. In an exemplary embodiment, a moisture absorbent or filler may be located in the inner space 25.

Referring to FIG. 2, the organic light-emitting display apparatus 2 includes an organic light-emitting unit 22 provided on a substrate 21, and a sealing film 26 that seals the organic light-emitting unit 22.

The organic light-emitting display apparatus 2 of FIG. 2 is different from the organic light-emitting display apparatus 1 of FIG. 1 in having the sealing film 26 as a thin film instead of the sealing substrate 23. The sealing film 26 may cover the organic light-emitting unit 22 and thus protect the organic light-emitting unit 22 from external air, for example. In an exemplary embodiment, the sealing film 26 may have a structure including an inorganic sealing layer including an inorganic material, such as a silicon oxide or a silicon nitride, and an organic sealing layer including an organic material, such as epoxy or polyimide, for example.

In the exemplary embodiment, the inorganic sealing layer and the organic sealing layer may each include a plurality of layers.

In an exemplary embodiment, an organic sealing layer includes a polymer. In an exemplary embodiment, the organic sealing layer may have a single layer structure or a multilayer structure including at least one of polyethylene terephthalate ("PET"), polyimide, polycarbonate, epoxy, polyethylene, and polyacrylate, for example. In an exemplary embodiment, the organic sealing layer may include polyacrylate or, in particular, by polymerizing a monomer composition including a diacrylate-based monomer and a triacrylate-based monomer. In an exemplary embodiment, the monomer composition may further include a monoacrylate-based monomer, for example. In an exemplary embodiment, the monomer composition may further include a known photoinitiator, such as 2,4,6-Trimethylbenzoyl-diphenyl-phosphineoxide ("TPO"), but the monomer composition is not limited thereto.

The inorganic sealing layer may have a single layer structure or a multilayer structure including a metal oxide or a metal nitride. In an exemplary embodiment, the inorganic sealing layer may include at least one of SiNx, $Al_2O_3$, $SiO_2$, and $TiO_2$, for example.

When the sealing film 26 has a structure including a plurality of layers, the uppermost layer thereof that is exposed to the outside may be an inorganic sealing layer to prevent moisture penetration into the organic light-emitting unit 22 of an organic light-emitting device.

In an exemplary embodiment, the sealing film 26 may have at least one sandwich structure including at least one organic sealing layer between at least two inorganic sealing layers. In an exemplary embodiment, the sealing film 26 may have at least one sandwich structure including at least one inorganic sealing layer between at least two organic sealing layers.

In an exemplary embodiment, the sealing film 26 may have a structure including a first inorganic sealing layer, a first organic sealing layer, and a second inorganic sealing layer that are sequentially stacked on the organic light-emitting unit 22. In an exemplary embodiment, the sealing film 26 may have a structure including a first inorganic sealing layer, a first organic sealing layer, a second inorganic sealing layer, a second organic sealing layer, a third inorganic sealing layer, a third organic sealing layer, and a fourth inorganic sealing layer that are sequentially stacked on the organic light-emitting unit 22.

In an exemplary embodiment, a halogenated metal layer, including LiF, for example, may be further included between the organic light-emitting unit 22 and the first inorganic sealing layer. The halogenated metal layer may prevent the organic light-emitting unit 22 from being damaged when the first inorganic sealing layer is provided by using a sputtering method or a plasma deposition method, for example.

In an exemplary embodiment, the first organic sealing layer may have an area that is smaller than that of the second inorganic sealing layer. In an exemplary embodiment, the second organic sealing layer may have an area that is smaller than that of the third inorganic sealing layer. In an exemplary embodiment, the first organic sealing layer may be completely covered by the second inorganic sealing layer. In an exemplary embodiment, the second organic sealing layer may be completely covered by the third inorganic sealing layer.

In another exemplary embodiment, the sealing film 26 may have a layer structure including low melting glass such as tin oxide (SnO), for example, but the sealing film 26 is not limited thereto.

Figure 3:
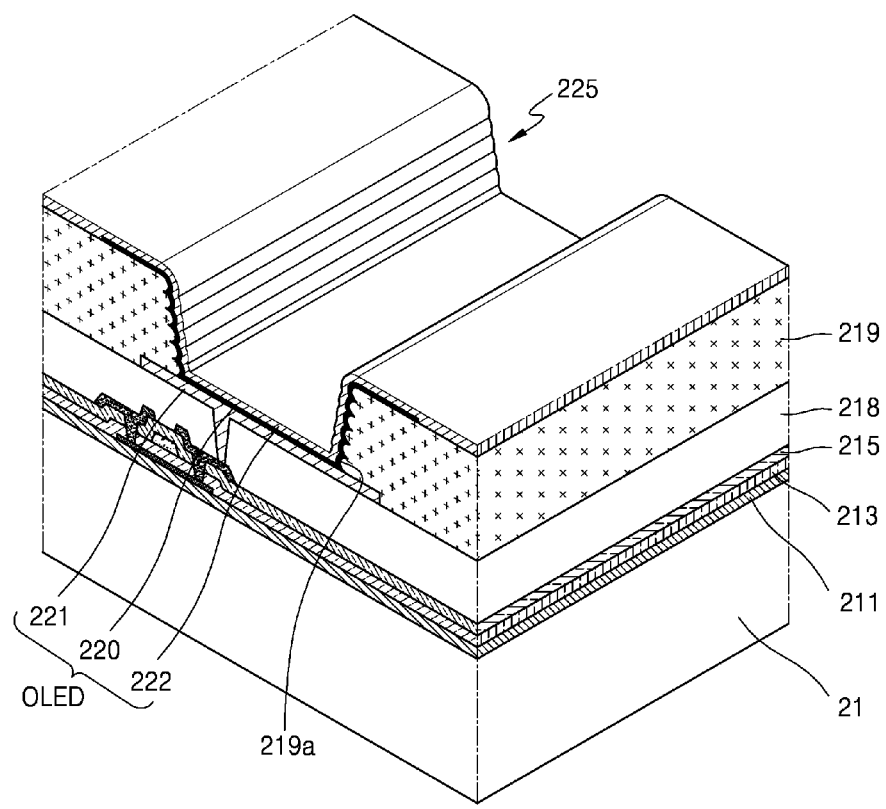
FIG. 3 is a perspective view of one pixel that may be included in region I shown in FIG. 1 or 2.
Figure 4A:
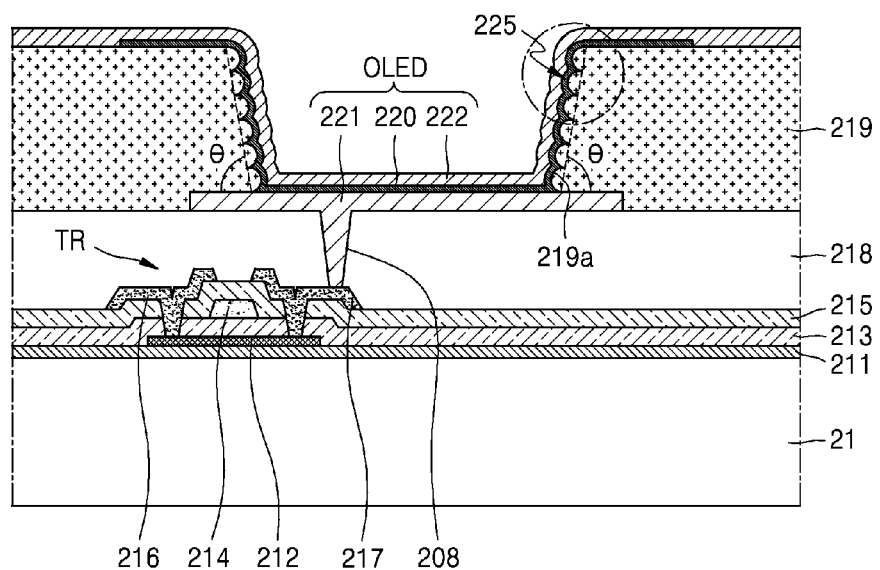
FIG. 4A is a cross-sectional view of an exemplary embodiment of one pixel that may be included in region I shown in FIG. 1 or 2.

FIG. 3 is a perspective view of one pixel that may be included in region I shown in FIG. 1 or 2. FIG. 4A is a cross-sectional view of an exemplary embodiment of one pixel that may be included in region I shown in FIG. 1 or 2, and FIG. 4B is an enlarged view of a bumpy structure of the one pixel of the FIG. 4A.

Figure 4B:
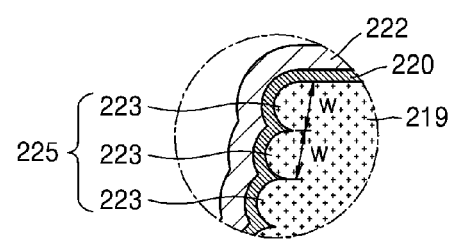
FIG. 4B is an enlarged view of a bumpy structure of the pixel of the FIG. 4A.

Referring to FIGS. 3, 4A and 4B, an organic light-emitting display apparatus includes a substrate 21, an organic light-emitting device OLED, and a pixel-defining layer 219 having a bumpy structure. Also, the organic light-emitting display apparatus may further include a buffer layer 211, a thin film transistor TR, and a planarization layer 218.

In an exemplary embodiment, the substrate 21 may include glass material having silicon dioxide ($SiO_2$) as a main component. However, the substrate 21 is not limited thereto and may include various other materials, such as a ceramic material, a transparent plastic material, or a metal material.

The buffer layer 211 may be disposed on the substrate 21 to prevent spread of impurity ions, prevent inflow of moisture or external air, and planarize an upper surface of the substrate 21. In exemplary embodiments, the buffer layer 211 may include an inorganic material, such as a silicon oxide, a silicon nitride, a silicon oxynitride, an aluminum oxide, an aluminum nitride, a titanium oxide, or a titanium nitride, an organic material, such as polyimide, polyester, or acryl, or any combination stacks provided thereof. In another exemplary embodiment, the buffer layer 211 may be omitted according to circumstances. In an exemplary embodiment, the buffer layer 211 may be provided by using various deposition methods, such as plasma-enhanced chemical vapor deposition ("PECVD"), atmospheric pressure chemical vapor deposition ("APCVD"), or low pressure CVD ("LPCVD").

The thin film transistor TR includes an active layer 212, a gate electrode 214, a source electrode 216, and a drain electrode 217. A gate insulating layer 213 is disposed between the gate electrode 214 and the active layer 212 for insulation of the gate electrode 214 from the active layer 212.

The active layer 212 may be provided on the buffer layer 211. The active layer 212 may include an inorganic semiconductor, such as amorphous silicon or polysilicon, or an organic semiconductor. In exemplary embodiments, the active layer 212 may include an oxide semiconductor. In an exemplary embodiment, the oxide semiconductor may include an oxide of a material including metal elements in Groups 12 through 14 including zinc (Zn), indium (In), gallium (Ga), tin (Sn), cadmium (Cd), germanium (Ge), and hafnium (Hf), and any combinations thereof.

The gate insulating layer 213 is provided on the buffer layer 211 and covers the active layer 212, and the gate electrode 214 is disposed on the gate insulating layer 213.

An interlayer insulating layer 215 is disposed on the gate insulating layer 213 and covers the gate electrode 214. The source electrode 216 and the drain electrode 217 are disposed on the interlayer insulating layer 215 and contact the active layer 212 through contact holes defined in the gate insulating layer 213 and interlayer insulating layer 215.

A structure of the thin film transistor TR is not limited to the structure described above, and the thin film transistor TR may have any type of thin film transistor structure. In the illustrated exemplary embodiment, the thin film transistor TR shown in FIGS. 3 and 4A is a top gate structure, but the invention is not limited thereto, and the thin film transistor TR may be a bottom gate structure having the gate electrode 214 under the active layer 212.

The organic light-emitting display apparatus may include a pixel circuit (not shown) including a capacitor, in addition to the thin film transistor TR.

The planarization layer 218 covers the thin film transistor TR and is disposed on the interlayer insulating layer 215. The planarization layer 218 may function to remove a phase difference and planarize the OLED so as to increase the emission efficiency of the OLED that is to be disposed on the planarization layer 218. Also, a through-hole 208 that exposes a part of the drain electrode 217 may be defined in the planarization layer 218.

In an exemplary embodiment, the planarization layer 218 may include an insulating material. In an exemplary embodiment, the planarization layer 218 may have a structure including a single layer or layers including an inorganic material, an organic material, or a combination thereof, and the structure may be provided by using various deposition methods. In exemplary embodiments, the planarization layer 218 may include material including at least one of a polyacrylate-based resin, an epoxy resin, a phenolic-based resin, a polyamide-based resin, a polyimide-based rein, an unsaturated polyester-based resin, a poly phenylenether-based resin, a poly phenylenesulfide-based resin, and benzocyclobutene ("BCB").

Also, a structure of the organic light-emitting display apparatus is not limited to the description above, and in another exemplary embodiment, at least one of the planarization layer 218 and the interlayer insulating layer 215 may be omitted according to circumstances.

The organic light-emitting device OLED is disposed on the planarization layer 218 and includes a first electrode 221, an interlayer 220 including an organic emission layer, and a second electrode 222. The pixel-defining layer 219 is disposed on the substrate 21 and the first electrode 221, and an opening 219a that exposes a center portion of the first electrode 221 is defined in the pixel-defining layer 219.

In an exemplary embodiment, the interlayer 220 may include a low-molecular weight or high-molecular weight organic material. When the interlayer 220 includes a low-molecular weight organic material, the interlayer 220 may include an organic emission layer and may further include at least one of a hole injection layer ("HIL"), a hole transport layer ("HTL"), an electron transport layer ("ETL"), and an electron injection layer ("EIL"), for example, in addition to the organic emission layer. The interlayer 220 of the illustrated exemplary embodiment is not limited thereto and may include an organic emission layer and other various functional layers as well. In an exemplary embodiment, the low-molecular weight organic material may be provided by vacuum deposition, for example. In an exemplary embodiment, the organic emission layer may be provided as independent layers according to red (R), green (G), and blue (B) pixels, and the HIL, HTL, ETL, and EIL may be commonly shared by the red (R), green (G), and blue (B) pixels as common layers.

However, when the interlayer 220 includes a high-molecular weight organic material, only a HTL may be included in the direction of the first electrode 221 from the organic emission layer. In an exemplary embodiment, the HTL may be disposed on the first electrode 221 by using an inkjet printing method or a spin-coating method, for example. The interlayer 220 may extend and be disposed on a sidewall of the pixel-defining layer 219.

The first electrode 221 is disposed on the planarization layer 218 and electrically connected to the drain electrode 217 of the thin film transistor TR via the through-hole 208 defined in the planarization layer 218.

The first electrode 221 may include a reflective material. In an exemplary embodiment, the first electrode 221 may include Ag, Mg, Al, Pt, Pd, Au, Ni, Nd, Ir, Cr, Li, Yb, or Ca, for example. The material of the first electrode 221 may include one or any combinations of the elements. Also, the first electrode 221 may have a structure including a single layer or layers including the metal described above and/or an alloy. In exemplary embodiments, the first electrode 221 may be a reflective electrode having a structure of indium tin oxide ("ITO")/Ag/ITO, for example.

In an exemplary embodiment, the first electrode 221 may serve as an anode, and the second electrode 222 may serve as a cathode. However, the first electrode 221 and the second electrode 222 are not limited thereto, and the first electrode 221 may serve as a cathode and the second electrode 222 may serve as an anode.

When the second electrode 222 is a cathode, the second electrode 222 may include a metal including at least one of Ag, Mg, Al, Pt, Pd, Au, Ni, Nd, Ir, Cr, Li, and Ca, for example. When the organic light-emitting display apparatus is a top emission type display apparatus, the second electrode 222 includes a material through which light may pass. In exemplary embodiments, the second electrode 222 may include a conductive metal oxide, such as ITO, indium zinc oxide ("IZO"), zinc tin oxide ("ZTO"), ZnO, or $In_2O_3$.

In exemplary embodiments, the second electrode 222 may include a thin film including at least one material including at least one of Li, Ca, LiF/Ca, LiF/Al, Al, Ag, Mg, and Yb, for example. In an exemplary embodiment, the second electrode 222 may have a structure including a single layer or layers including Mg:Ag, Ag:Yb, and/or Ag, for example. The second electrode 222 may be provided so that a common voltage is applied throughout all of the pixels, unlike the first electrode 221.

The pixel-defining layer 219, in which the opening 219a that exposes the first electrode 221 is defined, is disposed on the planarization layer 218 and the first electrode 221, and may define an emission region and a non-emission region of the organic light-emitting device OLED. The first electrode 221 is exposed through the opening 219a of the pixel-defining layer 219. Thus, light is emitted from the interlayer 220 and the second electrode 222 are sequentially stacked on a part of the first electrode 221 that is exposed through the opening 219a.

In other words, the first electrode 221 and the second electrode 222 may be a hole injection electrode and an electron injection electrode, respectively. When holes injected from the hole injection electrode and electrons injected from the electron injection electrode are combined, excitons are generated, and as the excitons drop from an excitation state to a ground state, light is emitted from the organic light-emitting display apparatus.

A sidewall of the opening 219a of the pixel-defining layer 219 includes a bumpy structure 225 including a plurality of bumps 223. As shown in FIGS. 3, 4A and 4B, the bumps 223 may be arranged in lines along the sidewall of the opening 219a. A groove is defined between every two bumps 223 which are adjacent, and thus a width w of the bumps 223 may be defined by an interval between the neighboring grooves. In the specification, the width w of the bumps 223 is defined as an interval between the neighboring grooves disposed along the sidewall of the opening 219a.

When an exposure process is performed to define the opening 219a, the bumpy structure 225 may be provided by generating a standing wave. This will be described later in more detail.

The pixel-defining layer 219 may include a photosensitive polymer. In an exemplary embodiment, the pixel-defining layer 219 may include an organic material, such as photoresist, a polyacryl-based resin, a polyimide-based resin, or an acryl-based resin. In exemplary embodiments, the pixel-defining layer 219 may include a transparent material. When the organic light-emitting display apparatus is sealed with the sealing substrate 23 (see FIG. 1), a spacer (not shown) for maintaining an interval between the sealing substrate 23 and the organic light-emitting unit 22 may be further disposed on the pixel-defining layer 219.

The width w of the bumps 223 may vary depending on a wavelength of light to which the organic light-emitting display apparatus is exposed. In exemplary embodiments, the width w of the bumps 23 may have a value in a range of about 10 nanometers (nm) to about 500 nm, for example.

The sidewall of the opening 219a may be inclined at an inclination angle θ with respect to a surface of the substrate 21. In exemplary embodiments, the inclination angle θ may have a value in a range of about 0 degree)(°) to about 90°. The width w may be measured in a direction tilted along the inclination angle θ.

The width w of the bumps 223 or the inclination angle θ of the sidewall of the opening 219a may vary depending on a wavelength of light emitted from the interlayer 220 of the organic light-emitting device OLED. In exemplary embodiments, a width w of the bumps 223 may be provided proportionally to a wavelength of light emitted from the interlayer 220. In an exemplary embodiment, when the organic light-emitting device OLED emits red light, for example, a width of the bumps 223 on the sidewall of the opening 219a may be greater than a width w of the bumps 223 when the organic light-emitting device OLED emits blue light. In this regard, the bumpy structure 225 may be designed in consideration of light scattering or diffusion according to a wavelength of light emitted from the interlayer 220.

A part of the light generated from the interlayer 220 of an emission region is not emitted to the outside and may proceed in a side direction by total reflection between the first electrode 221 and the second electrode 222. The bump structure 225 of the opening 219a of the pixel-defining layer 219 may be provided to emit light to the outside by changing a pathway of the light. Also, the bump structure 225 may be provided to diffuse and/or scatter light that proceeds in a side direction. Therefore, the light that arrives at the sidewall may induce a mixed color.

That is, the bumpy structure 225 refracts, reflects, diffuses, and/or scatters light that proceeds in a side direction and thus changes a pathway of light so that the light may induce a mixed color. In this regard, the light extraction efficiency of the organic light-emitting display apparatus is improved, and a white angle difference ("WAD") according to an angle may decrease.

Figure 5A:
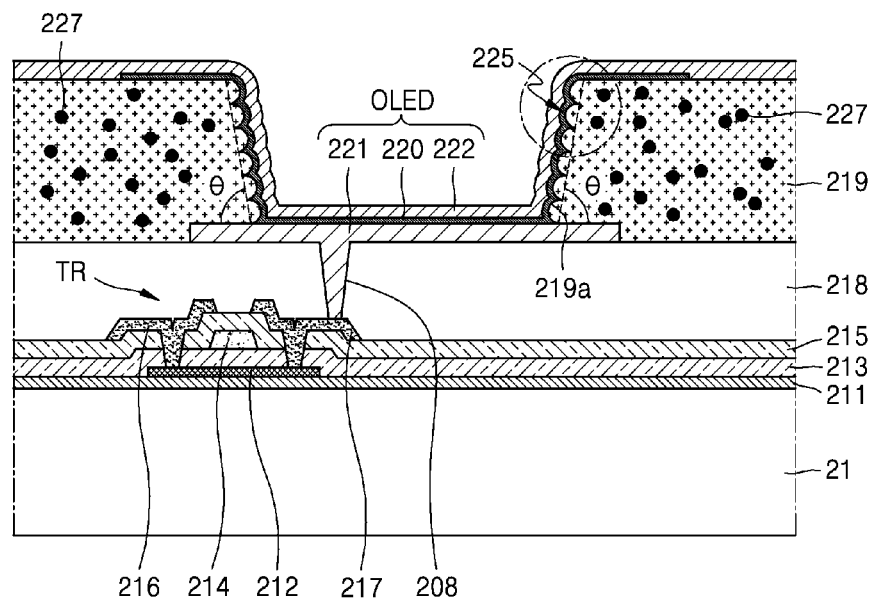
FIG. 5A is a cross-sectional view of another exemplary embodiment of one pixel that may be included in region I shown in FIG. 1 or 2.
Figure 5B:
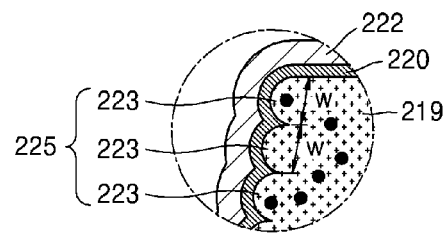
FIG. 5B is an enlarged view of a bumpy structure of the pixel of the FIG. 5A.

FIG. 5A is a cross-sectional view of another exemplary embodiment of one pixel that may be included in region I shown in FIG. 1 or 2, and FIG. 5B is an enlarged view of a bumpy structure of the one pixel of FIG. 5A. In FIGS. 5A and 5B, like reference numerals refer to the like elements in FIGS. 4A and 4B, and repeated descriptions thereof may be omitted for convenience of description.

An organic light-emitting display apparatus of FIGS. 5A and 5B is different from an organic light-emitting display apparatus of FIGS. 4A and 4B in that scattering particles 227 are included in the pixel-defining layer 219 of the organic light-emitting display apparatus of FIGS. 5A and 5B. Here, the inside of the pixel-defining layer 219 includes the bumpy structure 225. That is, the scattering particles 227 may be included in the bumpy structure 225.

The scattering particles 227 are particles that may diffuse or scatter light which may be appropriately selected according to use. In exemplary embodiments, the scattering particles 227 may have a nanosize. In an exemplary embodiment, a particle diameter of the scattering particles 227 may be in a range of about 50 nm to about 1000 nm, for example.

In exemplary embodiments, the scattering particles 227 may include inorganic particles, for example. In an exemplary embodiment, the scattering particles 227 may include silica, $ZrO_2$, $TiO_2$, $Al_2O_3$, $In_2O_3$, $ZnO$, $SnO_2$, or $Sb_2O_3$, for example.

In exemplary embodiments, the scattering particles 227 may be organic particles. In an exemplary embodiment, the scattering particles 227 may include polystyrene, polymethyl methacrylate ("PMMA"), an acryl-styrene copolymer, melamine, or polycarbonate, for example.

In an exemplary embodiment, the scattering particles 227 may include one type or at least two types.

When the light emitted from the interlayer 220 of the emission region proceeds to a side and penetrates to the inside of the pixel-defining layer 219, light scattering may be generated by the scattering particles 227, and thus light may be extracted to the outside. Also, a mixed light color may be induced by the light scattering.

Figure 6:
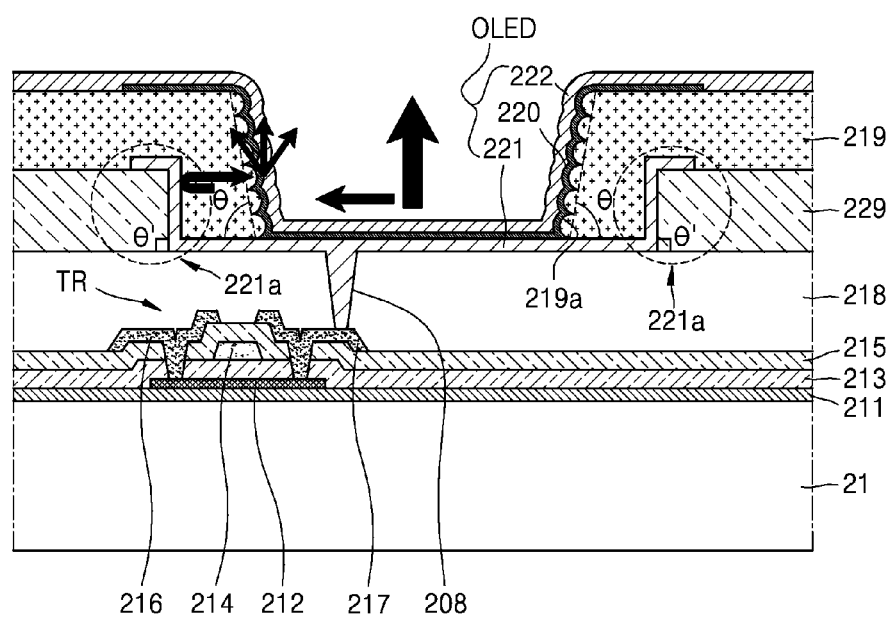
FIG. 6 is a cross-sectional view of another exemplary embodiment of one pixel that may be included in region I shown in FIG. 1 or 2.

FIG. 6 is a cross-sectional view of another exemplary embodiment of one pixel that may be included in region I shown in FIG. 1 or 2. In FIG. 6, like reference numerals refer to the like elements in FIGS. 4A and 4B, and repeated descriptions thereof may be omitted for convenience of description.

An organic light-emitting display apparatus of FIG. 6 is different from the organic light-emitting display apparatus of FIGS. 4A and 4B in that an inclination part 221a is provided at each of both ends of the first electrode 221. The inclination part 221a may be provided in the pixel-defining layer 219. The inclination part 221a may have an angle θ' which is substantially perpendicular to a surface of the substrate 21. That is, the angle θ' may be about 90° with reference to the surface of the substrate 21. In this regard, the inclination part 221a may serve to reflect and change a pathway of the light that proceeds in a side direction and passes the light back to the bumpy structure 225. The light that arrives at the bumpy structure 225 in this manner is scattered by the bumpy structure 225 and thus may induce a mixed color.

In order to provide the inclination part 221a, an auxiliary organic layer 229 may be disposed on the planarization layer 218. In an exemplary embodiment, the auxiliary organic layer 229 may include an organic material, such as a photosensitive polymer, photoresist, a polyacryl-based resin, a polyimide-based resin, or an acryl-based resin. In an exemplary embodiment, the auxiliary organic layer 229 may include the same material of the pixel-defining layer 219.

Figure 7:
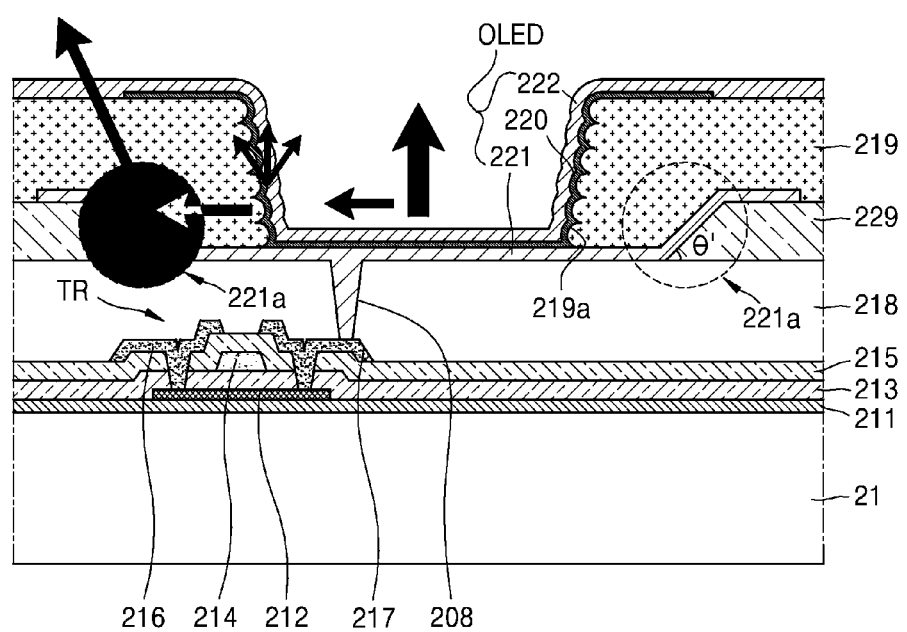
FIG. 7 is a cross-sectional view of another exemplary embodiment of one pixel that may be included in region I shown in FIG. 1 or 2.

FIG. 7 is a cross-sectional view of another exemplary embodiment of one pixel that may be included in region I shown in FIG. 1 or 2. In FIG. 7, like reference numerals refer to the like elements in FIG. 6, and repeated descriptions thereof may be omitted for convenience of description.

An organic light-emitting display apparatus of FIG. 7 is different from the organic light-emitting display apparatus of FIG. 6 in that an angle of the inclination part 221a of the first electrode 221 is different than that of the organic light-emitting display apparatus of FIG. 6. The inclination part 221a may be provided in the pixel-defining layer 219. The inclination part 221a may have an angle that is smaller than about 90° with respect to a surface of the substrate 21. In an exemplary embodiment, an angle of the inclination part 221a may be in a range of 20° to 70°, for example. In this regard, the inclination part 221a may serve to extract light to the outside by reflecting the light that proceeds towards a side and passes the bumpy structure 225. Accordingly, the light efficiency of the organic light-emitting display apparatus may be improved.

In order to provide the inclination part 221a, the auxiliary organic layer 229 may be disposed on the planarization layer 218. In an exemplary embodiment, the auxiliary organic layer 229 may include an organic material, such as a photosensitive polymer, photoresist, a polyacryl-based resin, a polyimide-based resin, or an acryl-based resin. In an exemplary embodiment, the auxiliary organic layer 229 may include the same material of the pixel-defining layer 219.

An angle θ' of the auxiliary organic layer 229 may be controlled according to an angle of the inclination part 221a. In an exemplary embodiment, the angle θ' of the auxiliary organic layer 229 may be controlled through various process, such as a halftone mask process or a hardening process.

FIGS. 8A to 8I are cross-sectional views illustrating a method of manufacturing an organic light-emitting display apparatus, according to an exemplary embodiment of the invention. In the exemplary embodiment, a method of manufacturing the organic light-emitting display apparatus shown in FIGS. 4A and 4B will be described.

Figure 8A:
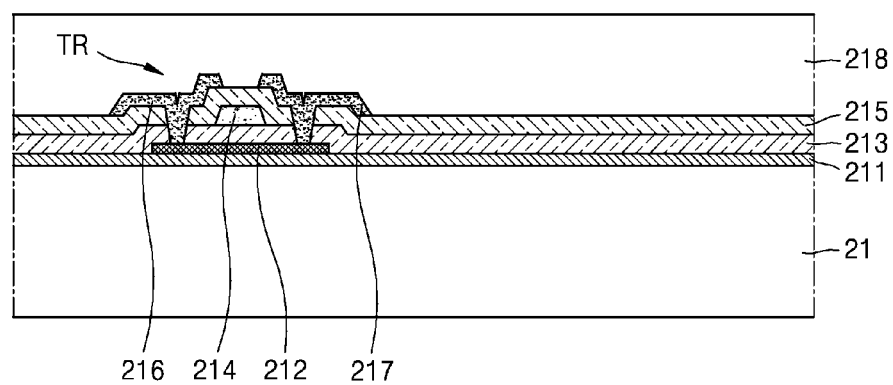
FIGS. 8A to 8I are cross-sectional views illustrating an exemplary embodiment of a method of manufacturing an organic light-emitting display apparatus, according to the invention.

Referring to FIG. 8A, the buffer layer 211 is disposed on the substrate 21. In an exemplary embodiment, the buffer layer 211 may be provided by using various deposition methods such as PECVD, APCVD, or LPCVD. A planarization process may be performed on the substrate 21 before providing the buffer layer 211 on the substrate 21. In an exemplary embodiment, a chemical and mechanical polishing process and/or an etch back process may be performed on the substrate 21 to secure a substantially flat upper surface of the substrate 21.

Next, the active layer 212 is disposed on the buffer layer 211. In an exemplary embodiment, the active layer 212 may include an inorganic semiconductor, such as amorphous silicon or polysilicon, or an organic semiconductor. In exemplary embodiments, the active layer 212 may include an oxide semiconductor. The active layer 212 may be provided by using various deposition methods such as PECVD, APCVD, or LPCVD. The active layer 212 may be disposed on the whole upper surface of the buffer layer 211 and may be patterned by etching or the like. Then, a crystallization process may be additionally performed thereon.

Then, the gate insulating layer 213 may be disposed on the buffer layer 211 to cover the active layer 212. The gate insulating layer 213 may be provided substantially homogeneously on the buffer layer 211 according to a profile of the active layer 212.

The gate electrode 214 is disposed on the gate insulating layer 213. The gate electrode 214 is disposed on a part of the gate insulating layer 213 where the active layer 212 is positioned thereunder. In an exemplary embodiment, the gate electrode 214 may include a metal, an alloy, a metal nitride, a conductive metal oxide, or a transparent conductive material, for example.

The interlayer insulating layer 215 is disposed on the gate insulating layer 213 in a manner to cover the gate electrode 214. The interlayer insulating layer 215 may be provided with a substantially uniform thickness on the gate insulating layer 213 according to a profile of the gate electrode 214. In an exemplary embodiment, the interlayer insulating layer 215 may include a silicon compound.

The source electrode 216 and the drain electrode 217 may be disposed on the interlayer insulating layer 215. The source electrode 216 and the drain electrode 217 are separate from the gate electrode 214 by an interval, and are disposed adjacent to the gate electrode 214. The source electrode 216 and the drain electrode 217 penetrate the interlayer insulating layer 215 and the gate insulating layer 213, and contact the two end portions of the active layer 212, respectively. In an exemplary embodiment, the source electrode 216 and the drain electrode 217 may include a metal, an alloy, a metal nitride, a conductive metal oxide, or a transparent conductive material, for example.

In exemplary embodiments, a through-hole exposing the active layer 212 may be defined by partially etching the interlayer insulating layer 215 and the gate insulating layer 213, and then a conducting layer (not shown) is disposed on the interlayer insulating layer 215 while filling the through-hole. Next, the conducting layer (not shown) may be patterned to provide the source electrode 216 and the drain electrode 217.

Then, the planarization layer 218 is disposed on the interlayer insulating layer 215 to cover the source electrode 216 and the drain electrode 217. The planarization layer 218 may have a thickness that may completely cover the source electrode 216 and the drain electrode 217. In an exemplary embodiment, the planarization layer 218 may include an inorganic material and/or an organic material. In an exemplary embodiment, the planarization layer 218 may be provided by using a spin-coating process, a printing process, a sputtering process, a CVD process, an atomic layer deposition ("ALD") process, a PECVD process, a HDP-CVD process, or a vacuum deposition process according to constituents, for example.

Figure 8B:
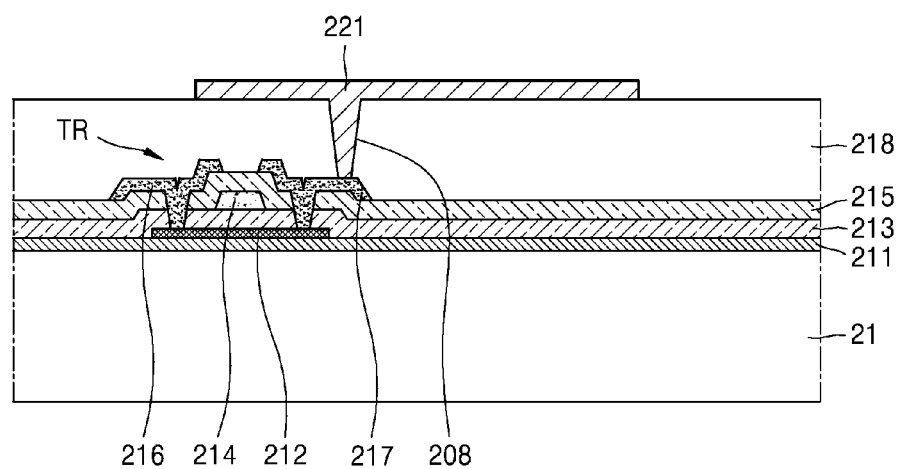

Referring to FIG. 8B, a through-hole 208 is defined through the planarization layer 218 to expose the drain electrode 217 of the thin film transistor TR. In the drawing, the through-hole 208 penetrates the planarization layer 218 only, but the through-hole 208 is not limited thereto.

Next, the first electrode 221 is disposed on the planarization layer 218. In an exemplary embodiment, the first electrode 221 may include a reflective material. In an exemplary embodiment, the first electrode 221 may include one element or a combination of elements including at least one of Ag, Mg, Al, Pt, Pd, Au, Ni, Nd, Ir, Cr, Li, Yb, and Ca, for example. Also, the first electrode 221 may have a structure including a single layer or layers including the metal and/or alloy described above. In exemplary embodiments, the first electrode 221 is a reflective electrode having a structure of ITO/Ag/ITO, for example.

In an exemplary embodiment, the first electrode 221 may be provided by using a sputtering process, a vacuum deposition process, a chemical vapor deposition process, a pulse laser deposition process, a printing process, or an ALD process, for example. The first electrode 221 may be patterned according to pixels. The first electrode 221 may extend to a part of the non-emission region that is adjacent to the first electrode 221 from the emission region. The first electrode 221 may be connected to the drain electrode 217 via the through-hole 208.

Figure 8C:
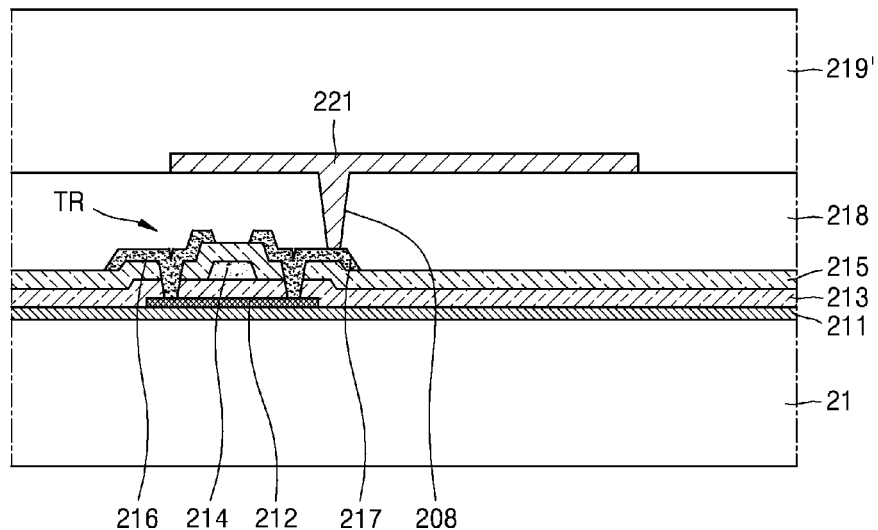

Referring to FIG. 8C, a photosensitive polymer 219' is disposed on the planarization layer 218 and the first electrode 221. In an exemplary embodiment, the photosensitive polymer 219' is an organic material that reacts to light and may include photoresist, a polyacryl-based resin, a polyimide-based resin, or an acryl-based resin, for example. In an exemplary embodiment, the planarization layer 218 and the first electrode 221 are coated with the photosensitive polymer 219' through a spin-coating or printing process, for example. In an exemplary embodiment, the photosensitive polymer 219' may include a transparent material. In exemplary embodiments, the photosensitive polymer 219' may be provided at a thickness in a range of about 0.5 micrometer (μm) to about 5 μm, for example. The thickness corresponds to a thickness that sensitively reacts to a standing wave, which will be described later in detail, and thus when a thickness of the photosensitive polymer 219' is within this range, a bumpy structure may be effectively provided.

In exemplary embodiments, the scattering particles 227 (see FIGS. 5A and 5B) may be dispersed in the photosensitive polymer 219'. The scattering particles 227 are particles that may diffuse or scatter light and thus may be appropriately selected according to use. In exemplary embodiments, the scattering particles 227 may have a nanosize. In an exemplary embodiment, a particle diameter of the scattering particles 227 may be in a range of about 50 nm to about 1000 nm.

In exemplary embodiments, the scattering particles 227 may include inorganic particles. In an exemplary embodiment, the scattering particles 227 may include silica, $ZrO_2$, $TiO_2$, $Al_2O_3$, $In_2O_3$, ZnO, $SnO_2$, or $Sb_2O_3$, for example.

In exemplary embodiments, the scattering particles 227 may include organic particles. In an exemplary embodiment, the scattering particles 227 may include polystyrene, PMMA, an acryl-styrene copolymer, melamine, or polycarbonate, for example.

The scattering particles 227 may include one type or at least two types.

Figure 8D:
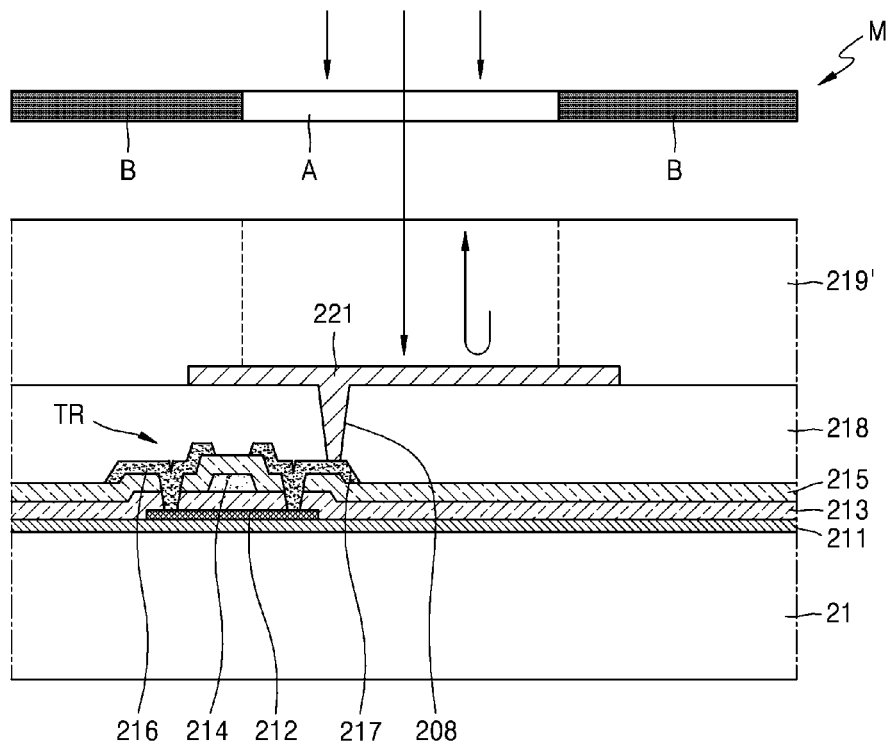

Referring to FIG. 8D, an exposure process is performed on the photosensitive polymer 219' by using a mask M.

The mask M includes a transmissive region A through which light passes and a non-transmissive region B through which light does not pass, and the transmissive region A is disposed on an area corresponding to a location where the opening 219a will be defined. In an exemplary embodiment, a semi-transmissive region (not shown) may be disposed between the transmissive region A and the non-transmissive region B to control an angle of the sidewall of the opening 219a.

The area where the opening 219a will be defined by using the mask M is exposed to light. In an exemplary embodiment, the exposure may be performed by a single-wavelength light source. The first electrode 221 may be a reflective electrode and may reflect incident light from the single-wavelength light source. In an exemplary embodiment, the first electrode 221 may include Ag, Mg, Al, Pt, Pd, Au, Ni, Nd, Ir, Cr, Li, Yb, or Ca. The material of the first electrode 221 may include one or a combination of the elements. Also, the first electrode 221 may have a structure including a single layer or layers including the metal and/or an alloy described above. In exemplary embodiments, the first electrode 221 may include a reflective electrode having a structure of ITO/Ag/ITO.

A standing wave in the thickness direction of the photosensitive polymer 219' is generated by interference of light entering the photosensitive polymer 219' and light reflected by the first electrode 221. When a wavelength of the single-wavelength light source is $\lambda$, an intensity of the standing wave provides a peak at a period of about $\lambda/2n$ (where, n is a refractive index of the photosensitive polymer 219'). In exemplary embodiments, a wavelength of the single-wavelength light source may be in a range of about 300 nm to about 500 nm. In an exemplary embodiment, a wavelength of the light source may be about 365 nm or about 436 nm, for example.

Figure 8E:
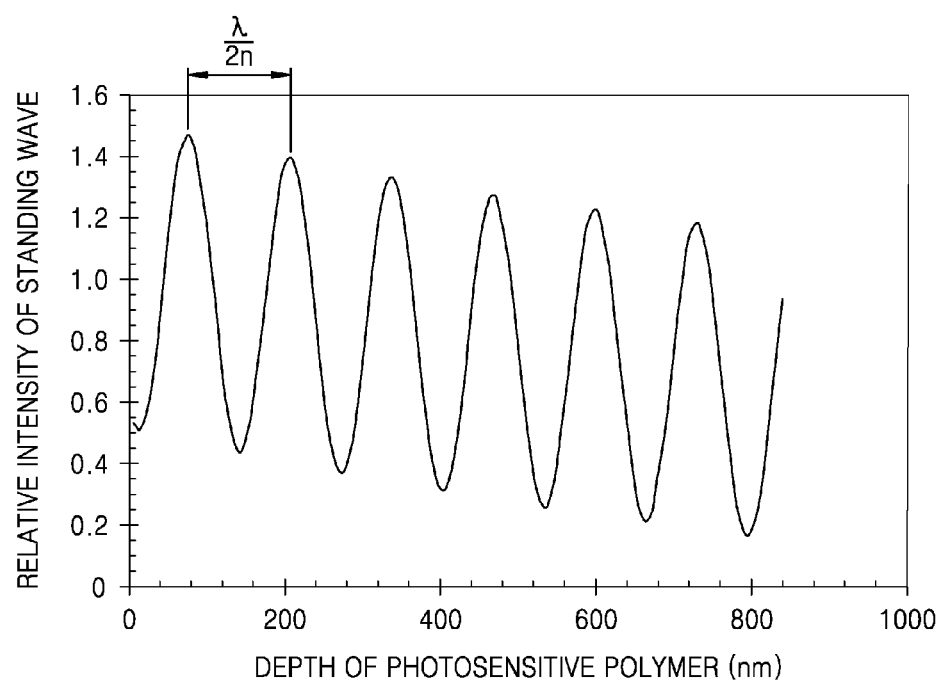

FIG. 8E illustrates an intensity of a standing wave provided in the photosensitive polymer 219' by the single-wavelength light source. FIG. 8E shows an intensity of a standing wave when the wavelength of the light source is 436 nm and a thickness of the photosensitive polymer 219' is 850 nm. The standing wave has a periodical peak of a standing wave intensity in a depth direction on an upper surface of the photosensitive polymer 219'. The change in the intensity of the standing wave denotes a change in the intensity of light of an area where the opening 219a will be defined. A peak to peak interval of the standing wave is substantially $\lambda/2n$ (where, $\lambda$ is a wavelength of light performing the exposure and n is a refractive index of the photosensitive polymer). The bumpy structure 225 is provided on the sidewall of the opening 219a by the intensity of the standing save.

Figure 8F:
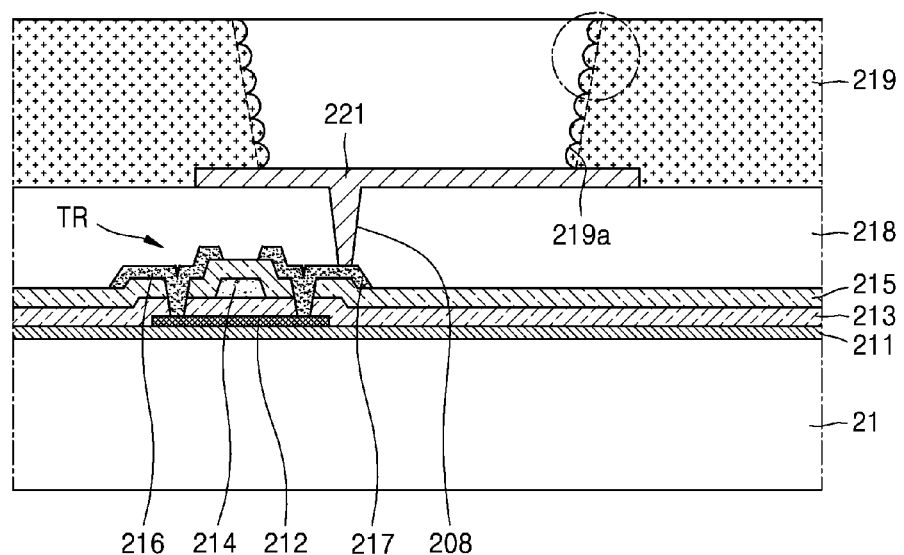
Figure 8G:
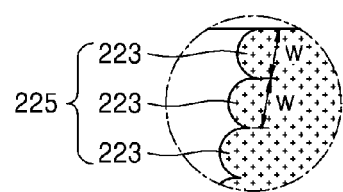

Referring to FIGS. 8F and 8G, an etching process is performed after the exposure process.

The pixel-defining layer 219, in which the opening 219a that exposes the first electrode 221 is defined, is completed by performing the etching process. In an exemplary embodiment, the etching process may be performed by a wet process, a dry process, or a combination thereof.

A plurality of bumps 223 are provided on the sidewall of the opening 219a by the standing wave provided during the exposure process. A width of the bumps 223 may be defined by a wavelength of the single-wavelength light source and a refractive index of the photosensitive polymer 219' that are used during the exposure process. The width of each of the bumps 223 may be substantially defined by $\lambda/2n$ (where, $\lambda$ is a wavelength of light performing the exposure and n is a refractive index of the photosensitive polymer). Here, the width w of the bumps 223 may be defined by a distance of a groove that is defined between two bumps 223.

After defining the opening 219a, the method may include a process of hardening the pixel-defining layer 219. In exemplary embodiments, the hardening may include two processes. In an exemplary embodiment, the hardening may be performed by hardening the pixel-defining layer 219 at a first temperature for a first period of time and by hardening the pixel-defining layer 219 at a second temperature for a second period of time. Here, the first temperature is lower than a temperature where the pixel-defining layer 219 is reflowed, and the first period of time may be greater than the second period of time. That is, the pixel-defining layer 219 is hardened at the first temperature so that the reflow is not performed for a long time, and then the pixel-defining layer 219 may be hardened at the second temperature, which is higher than the first temperature, for a short time. In this regard, the bumpy structure 225 may be maintained after the hardening process.

Figure 8H:
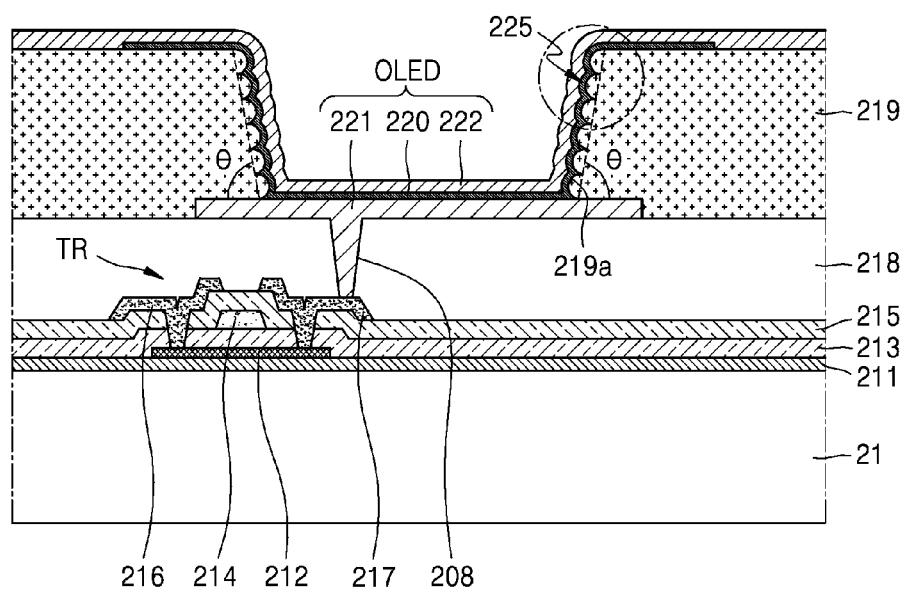
Figure 8I:
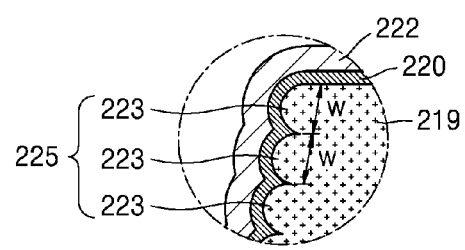

Referring to FIGS. 8H and 8I, the interlayer 220 may be disposed on the first electrode 221 through the opening 219a of the pixel-defining layer 219. The interlayer 220 including an organic emission layer may be disposed on the sidewall of the opening 219a. The interlayer 220 may include a single layer or layers stacked in combination. In exemplary embodiments, the interlayer 220 may be provided by using a vacuum deposition method, for example. In another exemplary embodiment, the interlayer 220 may be provided by inkjet printing, spin-coating, or a thermal transfer type using a laser, for example.

Next, the second electrode 222 may be disposed on the interlayer 220. The second electrode 222 may be disposed on the pixel-defining layer 219.

In an exemplary embodiment, the second electrode 222 may include a transparent conductive material. In exemplary embodiments, the second electrode 222 may include a transparent conductive metal, such as ITO, IZO, ZTO, ZnO, or $In_2O_3$. In another exemplary embodiment, the second electrode 222 may include a thin film including at last one material that includes at least one of Li, Ca, LiF/Ca, LiF/Al, Al, Ag, Mg, and Yb, for example. In an exemplary embodiment, the second electrode 222 may include a single layer or layers including Mg:Ag, Ag:Yb, and/or Ag, for example.

In an exemplary embodiment, the second electrode 222 may be provided by using a sputtering process, a vacuum deposition process, a chemical vapor deposition process, a pulse laser deposition process, a printing process, or an ALD process, for example. In exemplary embodiments, the second electrode 222 may be provided so that a common voltage is applied throughout all of the pixels.

In an exemplary embodiment, a protection layer (not shown) may be additionally disposed on the second electrode 222. The protection layer may cover and protect the organic light-emitting device OLED. The protection layer may be an inorganic insulating layer and/or an organic insulating layer. In an exemplary embodiment, the protection layer may be deposited by using various deposition methods, such as PECVD, APCVD, or LPCVD.

Although the method of manufacturing an organic light-emitting display apparatus has been described for the organic light-emitting display apparatus shown in FIGS. 4A and 4B, but various modifications may be made based on the exemplary embodiments.

As described above, according to the one or more of the above exemplary embodiments of the invention, an organic light-emitting display apparatus includes a bumpy structure on a sidewall of an opening in a pixel-defining layer.

The bumpy structure may serve to change a pathway of light so that the light incident in a side direction is refracted, reflected, diffused, and/or scattered to be emitted to the outside and may serve to induce a mixed light color. Accordingly, a light extraction efficiency of the organic light-emitting display apparatus improves, and a WAD according to an angle may be improved.

Also, the bumpy structure is provided by an exposing process using a standing wave, and thus the process may be simplified.

It should be understood that the organic light-emitting display apparatus according to the exemplary embodiments described therein should be considered in a descriptive sense only and not for purposes of limitation. Descriptions of features or exemplary embodiments within each exemplary embodiment should typically be considered as available for other similar features or other exemplary embodiments.

While one or more exemplary embodiments of the invention have been described with reference to the figures, it will be understood by those of ordinary skill in the art that various changes in form and details may be made therein without departing from the spirit and scope of the invention as defined by the following claims.

What is claimed is:

1. An organic light-emitting display apparatus comprising:
   a substrate;
   a first electrode disposed on the substrate;
   a pixel-defining layer which is disposed on the substrate and the first electrode and in which an opening which exposes a central part of the first electrode is defined;
   an interlayer which is disposed on the first electrode and comprises an organic light-emitting layer; and
   a second electrode disposed on the interlayer,
   wherein a sidewall of the opening comprises a bumpy structure in which a plurality of bumps is disposed.

2. The organic light-emitting display apparatus of claim 1, wherein the pixel-defining layer comprises a transparent photosensitive polymer.

3. The organic light-emitting display apparatus of claim 1, wherein a width of each of the plurality of bumps is in a range of about 10 nanometers to about 500 nanometers.

4. The organic light-emitting display apparatus of claim 1, wherein the pixel-defining layer comprises scattering particles in a nanosize dispersed therein.

5. The organic light-emitting display apparatus of claim 4, wherein the scattering particles comprise at least one of silica, $TiO_2$, and $ZrO_2$.

6. The organic light-emitting display apparatus of claim 4, wherein the scattering particles comprise at least one of polystyrene and polymethyl methacrylate.

7. The organic light-emitting display apparatus of claim 1, wherein a width of each of the plurality of bumps and an inclination angle of the sidewall are defined based on a wavelength of light emitted from the interlayer.

8. The organic light-emitting display apparatus of claim 1, wherein the first electrode comprises an inclined part having a slope with respect to a surface of the substrate at each of end portions of the first electrode.

9. The organic light-emitting display apparatus of claim 8, wherein the inclined part is substantially perpendicular to the surface of the substrate.

10. A method of manufacturing an organic light-emitting display apparatus, the method comprising:
    disposing a first electrode on a substrate;
    providing a pixel-defining layer which is disposed on the substrate and the first electrode, and in which an opening exposing a central part of the first electrode is defined;
    disposing an interlayer comprising an organic light-emitting layer on the first electrode; and
    disposing a second electrode on the interlayer,
    wherein
    a sidewall of the opening has a bumpy structure in which a plurality of bumps is provided, and the bumpy structure is provided by an exposing process using a standing wave when defining the opening.

11. The method of claim 10, wherein the providing the pixel-defining layer comprises:
disposing a photosensitive polymer on the substrate and the first electrode;
exposing an area where the opening is defined; and
defining the opening by etching the photosensitive polymer,
wherein the standing wave is provided between an upper surface of the first electrode and an upper surface of the photosensitive polymer due to the exposing the area.

12. The method of claim 11, wherein the exposing the area is performed by a single-wavelength light source.

13. The method of claim 10, further comprising:
hardening the pixel-defining layer at a first temperature for a first period of time; and
hardening the pixel-defining layer at a second temperature, which is higher than the first temperature, for a second period of time after the providing the pixel-defining layer,
wherein
the first temperature is lower than a temperature at which the pixel-defining layer is reflowed, and the first period of time is longer than the second period of time.

14. The method of claim 11, wherein the exposing the area includes exposing the area to light which is reflected by a material of the first electrode.

15. The method of claim 11, wherein a width of each of the plurality of bumps is substantially $\lambda/2n$, where $\lambda$ is a wavelength of light with which the exposing the area is performed, and n is a refractive index of the pixel-defining layer.

16. The method of claim 10, wherein a width of each of the plurality of bumps is in a range of about 10 nanometers to about 500 nanometers.

17. The method of claim 10, further comprising dispersing scattering particles in a nanosize inside the pixel-defining layer.

18. The method of claim 17, wherein the scattering particles comprise at least one of silica, $TiO_2$, and $ZrO_2$.

19. The method of claim 17, wherein the scattering particles comprise at least one of polystyrene and polymethyl methacrylate.

20. The method of claim 10, wherein a width of each of the plurality of bumps and an inclination angle of the sidewall are defined based on a wavelength of light emitted from the interlayer.

* * * * *